United States Patent
Buck, Jr.

(10) Patent No.: US 6,476,471 B1
(45) Date of Patent: Nov. 5, 2002

(54) MICROELECTRONIC-DEVICE ASSEMBLIES AND METHODS THAT EXCLUDE EXTRANEOUS ELEMENTS FROM SENSITIVE AREAS

(75) Inventor: Roy V. Buck, Jr., Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/525,739

(22) Filed: Mar. 14, 2000

(51) Int. Cl.[7] ............................................. H01L 23/02
(52) U.S. Cl. ....................... 257/678; 257/666; 257/670; 257/671; 257/672
(58) Field of Search ................................ 257/676, 667, 257/669, 670, 671, 672, 673, 674, 666

(56) References Cited

U.S. PATENT DOCUMENTS

| | | | |
|---|---|---|---|
| 5,021,864 A | | 6/1991 | Kelley et al. .................. 357/70 |
| 5,122,858 A | | 6/1992 | Mahulikar et al. ............ 357/70 |
| 5,352,852 A | * | 10/1994 | Chun .......................... 257/680 |
| 5,389,577 A | | 2/1995 | McClure ..................... 437/206 |
| 5,687,474 A | * | 11/1997 | Hamzehdoost ............... 29/832 |
| 5,693,573 A | * | 12/1997 | Choi ........................... 437/220 |
| 5,849,608 A | * | 12/1998 | Abe ............................ 257/666 |
| 5,929,514 A | | 7/1999 | Yalamanchili ............... 257/676 |
| 5,969,414 A | | 10/1999 | Parthasarathi ................ 257/675 |
| 6,064,576 A | * | 5/2000 | Edwards ...................... 257/778 |
| 6,204,454 B1 | * | 3/2001 | Gotoh ......................... 257/739 |
| 6,239,487 B1 | * | 5/2001 | Park et al. ................... 257/666 |
| 6,255,741 B1 | * | 7/2001 | Yoshihara et al. ........... 257/414 |

FOREIGN PATENT DOCUMENTS

JP 405315510 A * 11/1993

* cited by examiner

Primary Examiner—Olik Chaudhuri
Assistant Examiner—Nathan W. Ha
(74) Attorney, Agent, or Firm—Koppel, Jacobs, Patrick & Heybl

(57) ABSTRACT

Microelectronic-device assemblies and methods are provided that enhance operation of microelectronic devices because they exclude extraneous elements from sensitive device areas. They are especially suited for devices that carry a plurality of bonding pads on a circuit face that has a sensitive area. A lead frame defines a paddle that has an area less than that of the device face. The paddle is spaced from the face and positioned to cover the sensitive area and expose the pads. A plastic ring is arranged to surround the sensitive area and abut the face and the paddle. Encapsulation in an overmold thus forms a void within the ring and between the device face and the paddle and extraneous elements are excluded from this void.

19 Claims, 4 Drawing Sheets

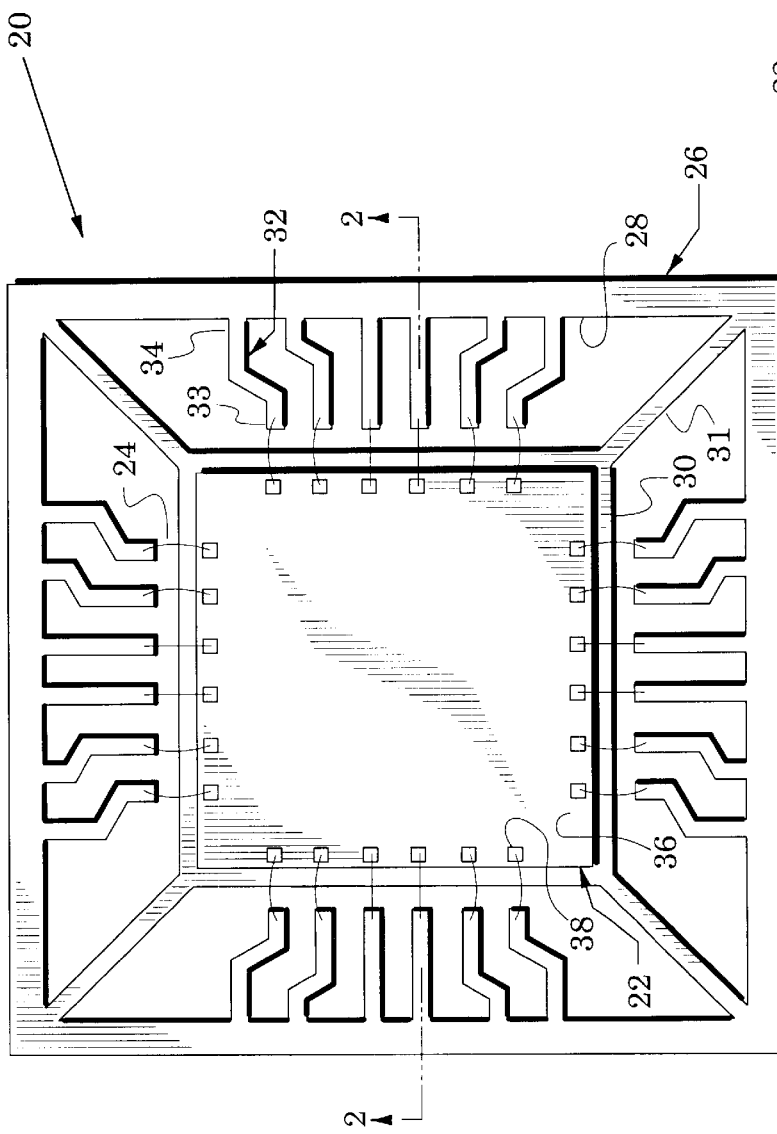
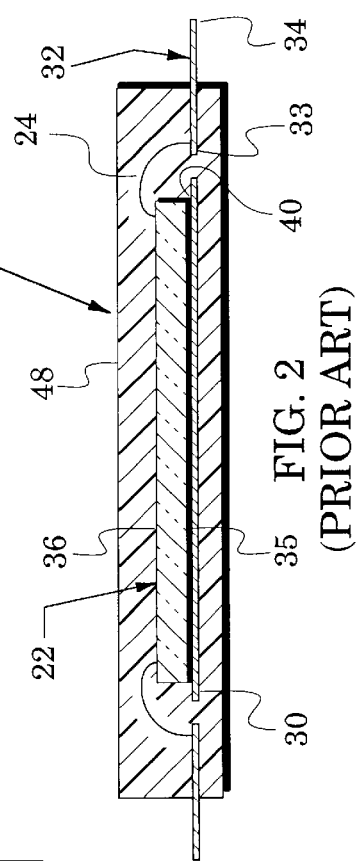
FIG. 1 (PRIOR ART)
FIG. 2 (PRIOR ART)

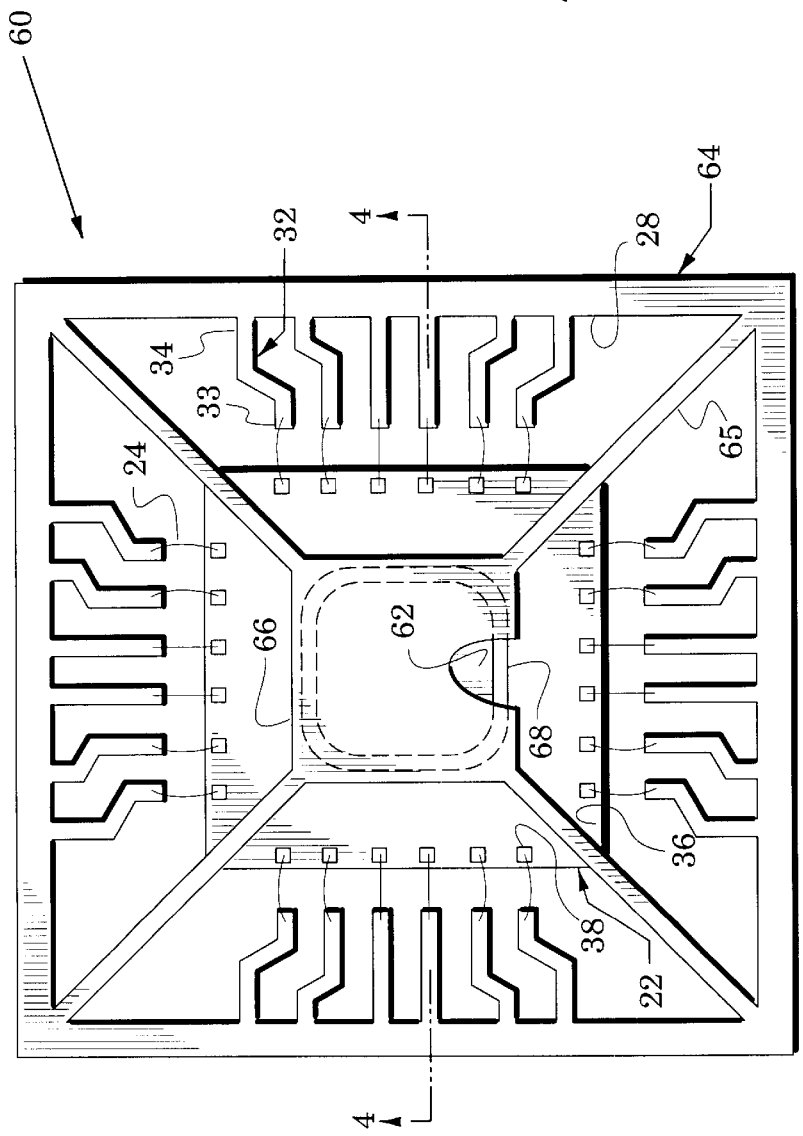
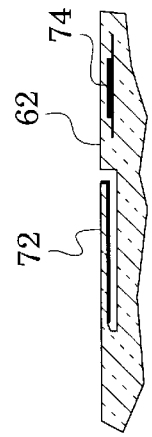
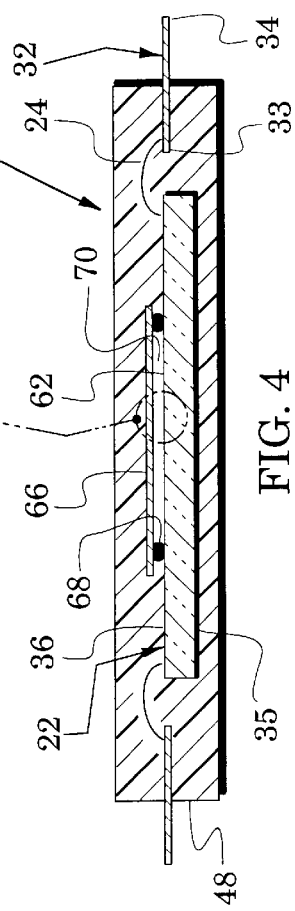
FIG. 3
FIG. 4
FIG. 5

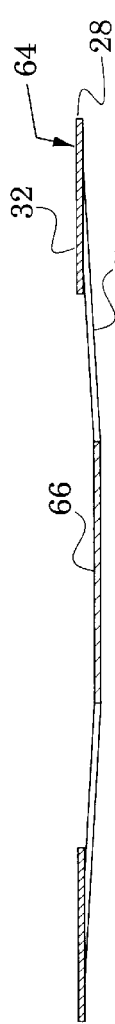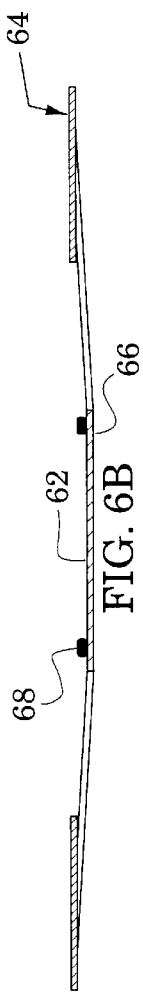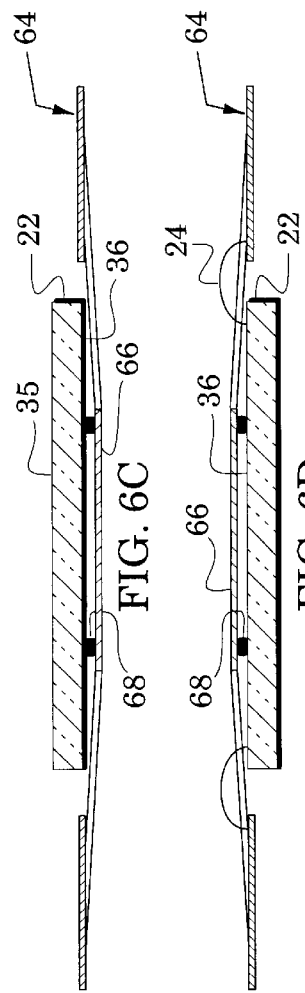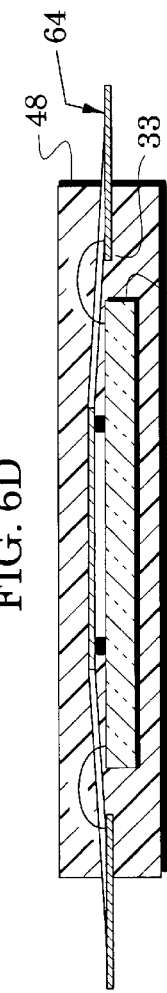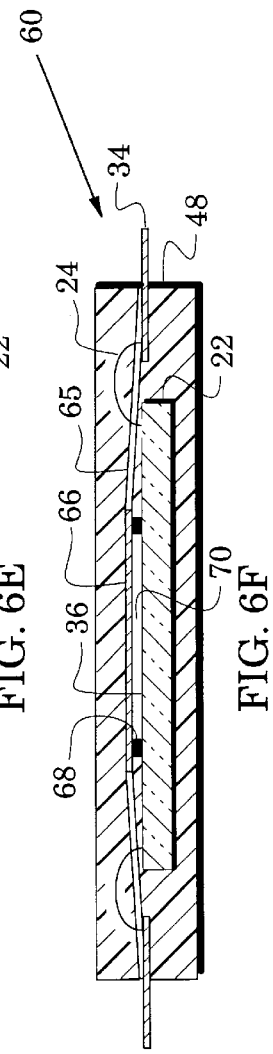
FIG. 6A  FIG. 6B  FIG. 6C  FIG. 6D  FIG. 6E  FIG. 6F

MICROELECTRONIC-DEVICE ASSEMBLIES AND METHODS THAT EXCLUDE EXTRANEOUS ELEMENTS FROM SENSITIVE AREAS

BACKGROUND OF THE INVENTION

1. Field of the Invention

The present invention relates generally to microelectronic devices and, more particularly, to the housing of microelectronic devices.

2. Description of the Related Art

Microelectronic devices are typically housed to provide protection from environmental factors (e.g., moisture, dust and other contaminants) and yet provide operational access to the devices. A variety of microelectronic-device housings have been disclosed (e.g., see U.S. Pat. Nos. 5,021,864, 5,122,858, 5,389,577, 5,929,514 and 5,969,414) and an exemplary housing is illustrated by the conventional microelectronic-device assembly 20 of FIGS. 1 and 2.

The assembly 20 includes a microelectronic device 22, bonding wires 24 and a lead frame 26 that defines a tie bar 28 that is coupled to a paddle 30 by tie-bar supports 31. The lead frame also defines a plurality of elongate leads 32 that each have an inner end 33 directed towards the microelectronic device 22 and an outer end 34 that couples to the tie bar 28.

The microelectronic device 22 has a back face 35 and a front or circuit face 36 that includes a plurality of bonding pads 38. The bonding pads are generally located proximate to the perimeter of the circuit face 36 and are connected to various microelements within the microelectronic device 22 to thus provide operational access to the microelectronic device.

The back face 35 has a back-face area and the front circuit face 36 has a circuit-face area that typically equals the back-face area. In contrast, the paddle 30 has a paddle area that generally exceeds the back-face area to thereby facilitate carrying the back face 35 on the paddle 30 (accordingly, portions of the paddle 30 are typically visible all about the perimeter of the microelectronic device 22). The back face 34 is generally secured to the paddle with an adhesive 40 (e.g., an epoxy adhesive or tape) or with solder.

Each of the bonding wires 24 is coupled to a respective one of the bonding pads 38 and a respective one of the inner lead ends 33. The bonding wires permit the bonding pads to be accessed from the outer lead ends 34.

As shown in FIG. 2, a plastic overmold 48 is typically formed to encapsulate the microelectronic device 22, the bonding wires 24, the paddle 30 and the inner ends 33 of the leads 32. After this encapsulation, the tie bar (28 in FIG. 1) and its tie-bar supports (31 in FIG. 1) are removed so that only the outer ends 34 extend from the overmold 48 for operational access of the microelectronic device 22.

The lead frame 26 is typically formed from a conductive metal (e.g., a nickel-iron or a copper-based alloy), the bonding wires are typically aluminum or gold, the overmold 48 is generally a thermosetting material (e.g., epoxy, silicone, or urethane) and exemplary dimensions of the bonding pads are 100×100 μm.

Although it may take on other forms, the microelectronic device 22 is typically a semiconductor die that contains a large number of microelements organized in an integrated circuit and, accordingly, the back face 35 is generally a semiconductor substrate. The integrated-circuit microelements are often microelectronic elements (e.g., transistors, resistors, capacitors and interconnection traces) but they may also be micromachined mechanical elements that include movable members (e.g., the vibrating members of a gyroscope or the acceleration-responsive mass of an accelerometer).

Microelectronic elements may also include movable members (e.g., the arm of a microswitch or microrelay) and, in addition, the performance of some microelectronic elements (e.g., thin film resistors) may be sensitive to pressure. Operation of other exemplary microelements may be degraded by outgassing of constituents from various assembly parts (e.g., the overmold).

When these sensitive microelements are positioned proximate to an area of the front circuit face 36, it is desirable to exclude extraneous elements (i.e., elements that restrict or degrade operation) from this sensitive area. Although a thin cover coat (e.g., a polyimide) is conventionally applied to the front circuit face 36 before the microelectronic device 22 is encapsulated in the overmold 48, such coatings fail to provide the desired exclusion.

SUMMARY OF THE INVENTION

The present invention is directed to microelectronic-device assemblies and methods that enhance operation of microelectronic devices because they exclude extraneous elements from sensitive device areas.

The invention is particularly suited for a device that has a sensitive area on a device face that carries a plurality of bonding pads. In an embodiment, a paddle is provided that has an area less than that of the device face and it is spaced from the face and positioned to cover the sensitive area and expose the pads. A plastic ring is arranged to surround the sensitive area and abut the face and the paddle.

A lead frame preferably forms the paddle and a plurality of elongate leads. Each of the leads has an inner end and an outer end and each of a plurality of bonding wires is coupled between a respective one of the pads and a respective one of the inner ends.

An overmold is arranged to encapsulate the die, the paddle, the ring and the inner lead ends and expose the outer lead ends to provide operational access to the microelectronic device. A void is thus defined within the ring and between the device face and the paddle and, accordingly, extraneous elements are excluded from this void. When the plastic ring includes an electrically-conductive filler, it and the paddle provide an electrical and magnetic shield for the device face.

The novel features of the invention are set forth with particularity in the appended claims. The invention will be best understood from the following description when read in conjunction with the accompanying drawings.

BRIEF DESCRIPTION OF THE DRAWINGS

FIG. 1 is a plan view of a conventional microelectronic-device assembly that includes a microelectronic device, wirebonds and a lead frame that defines a paddle, leads and a connecting tie bar;

FIG. 2 is an enlarged view along the plane 2—2 of FIG. 1 that shows the microelectronic-device assembly of FIG. 1 after the microelectronic device, wirebonds, paddle and inner lead ends have been encapsulated in an overmold and after the tie bar has been removed;

FIG. 3 is a plan view of a microelectronic-device assembly embodiment of the present invention;

FIG. 4 is an enlarged view along the plane 4—4 of FIG. 3 that shows the microelectronic-device assembly of the present invention after the microelectronic device, wirebonds, paddle and inner lead ends of FIG. 3 have been encapsulated in an overmold and after the tie bar has been removed;

FIG. 5 is a greatly enlarged view of a movable microelement within the circle 5 of FIG. 4;

FIGS. 6A–6F are cross-sectional views that illustrate fabrication process steps of the invention wherein FIG. 6F is similar to FIG. 4.

DETAILED DESCRIPTION OF THE PREFERRED EMBODIMENTS

Figure 7:
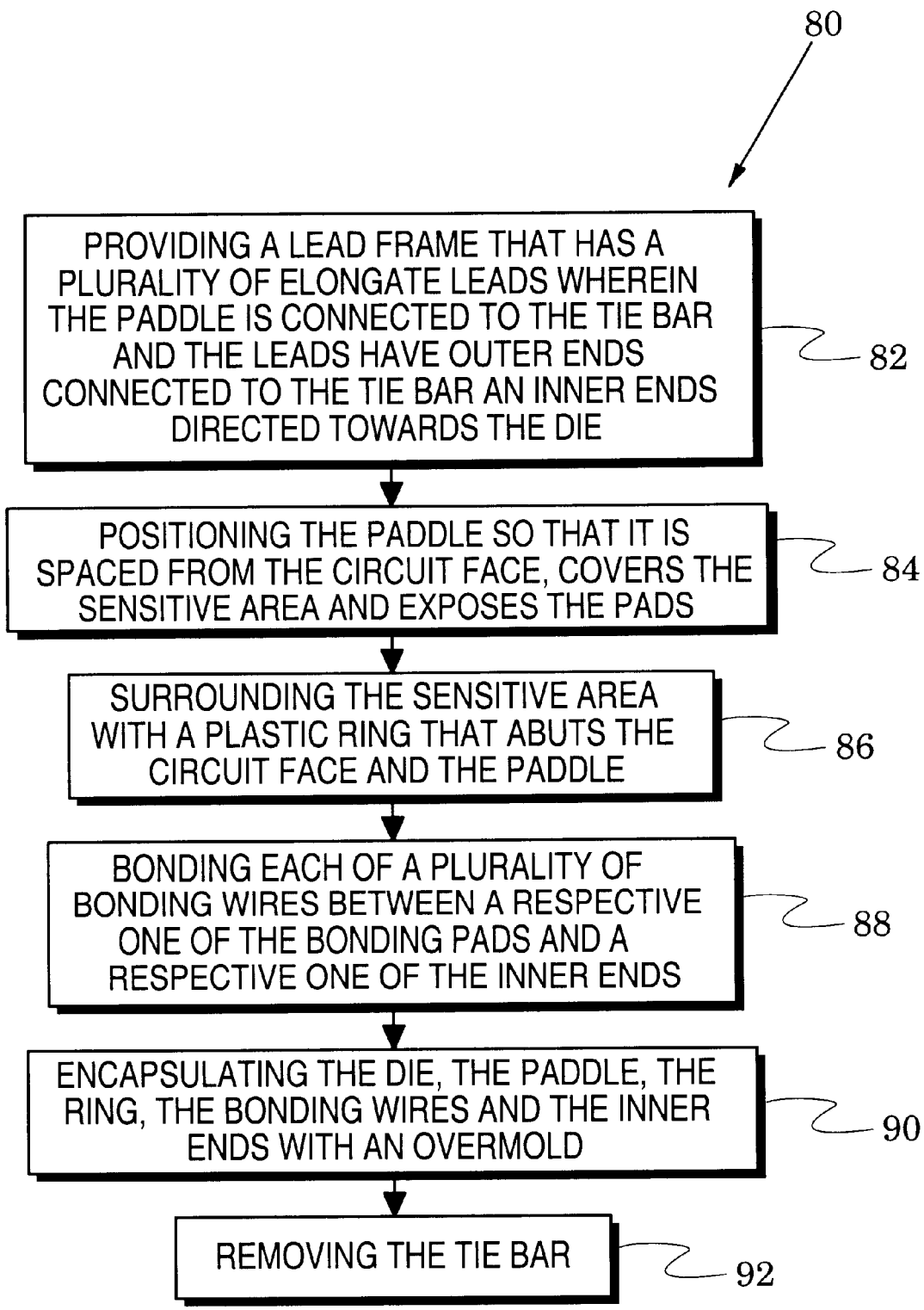
FIG. 7 is a flow chart that illustrates process steps of the present invention.

FIGS. 3–5 illustrate an embodiment 60 of a microelectronic-device assembly of the present invention. The assembly 60 includes elements of the microelectronic-device assembly 20 of FIGS. 1 and 2 with like elements indicated by like reference numbers.

In contrast to the assembly 20, however, the assembly 60 excludes extraneous elements from a sensitive area 62 of the front circuit face 36 of a microelectronic device 22. In further contrast, the microelectronic-device assembly 60 has a paddle with a paddle area less than the circuit-face area of the microelectronic device 22 and this paddle is spaced from the circuit face 36 of the microelectronic device rather than abutting its back face 35.

In particular, the microelectronic-device assembly 60 has a lead frame 64 that includes the leads 32 and tie bar 28 of the lead frame 26 of FIG. 1 but has extended tie bar supports 65 to reach a paddle 66 whose area has been reduced from the circuit-face area of the microelectronic device 22. The paddle 66 is spaced from the front circuit face 36 of the microelectronic device 22 and is positioned to cover the sensitive area 62 but expose the bonding pads 38 so that they are accessible to the bonding wires 24.

A plastic preform in the shape of a continuous ring 68 is arranged to surround the sensitive area 62 and abut the front circuit face 36 and the paddle 66. Accordingly, a void 70 is established over the sensitive area 62 when the overmold 48 is applied to encapsulate the microelectronic device 22, the bonding wires 24, the paddle 66, the ring 68 and the inner lead ends 33.

FIG. 5 is a greatly enlarged view of the front circuit face 36 within the sensitive area 62. It illustrates an exemplary movable microelement 72 and an exemplary pressure-sensitive microelectronic element 74 (e.g., a thin film resistor) that are proximate to the front circuit face 36 in the sensitive area 62. Although not shown in detail, the microelement 72 can be one that is micromachined to realize a specific microstructure (e.g., a switch arm, a vibrating accelerometer element or an acceleration-responsive mass of an accelerometer). Extraneous elements (i.e., elements that restrict or degrade operation) are excluded from these sensitive microelements because the microelectronic-device assembly 60 maintains a void (70 in FIG. 4) over the sensitive area 62.

The ring 68 may be formed with a thermoplastic material (e.g., a phenoxy, polyethylene or vinyl) or a thermosetting material (e.g., epoxy or phenolic). Thermosetting materials cure by chemical reaction when heated and, once cured, do not soften or reflow. That is, thermosetting materials change irreversibly to a hard rigid form when heated and cannot be reheated or softened without adverse affect on their properties.

In contrast, thermoplastic materials have the advantage that they can repeatably be made to flow by heat application. This process can be repeated without any important change in properties. Because thermoplastic materials are already cured, they are preferred for the ring 68 because they generally exhibit less outgassing of constituents.

Exemplary fabrication process steps are illustrated in FIGS. 6A–6F. The leadframe 64 of FIG. 3 is formed in FIG. 6A to define the tie bar 28 that couples to the leads 32 and, via the tie bar supports 30, to the paddle 66. The plastic ring 68 is positioned on the paddle 66 in FIG. 6B and arranged so that it will surround the sensitive area (62 in FIGS. 3 and 4) of the front circuit face of the microelectronic device (22 in FIGS. 3 and 4).

In FIG. 6C, the front circuit face 36 of the microelectronic device is positioned to abut the ring 68. If a thermoplastic material has been chosen for the ring 68, force and heat are applied to the ring to enhance its adhesion to the paddle 66 and the front circuit face 36. If a thermosetting material has been chosen for the ring 68, heat is applied to the ring to cure the material.

The assembly of FIG. 6C is inverted in FIG. 6D and the bonding wires 24 attached. The microelectronic device 22, the paddle 66, the ring 68 and the inner lead ends 33 are encapsulated in an overmold 48 in FIG. 6E which leaves the void 70 over the sensitive area 62. In FIG. 6F, the tie bar 28 of FIG. 6A is removed and the tie bar supports 65 are trimmed back to the overmold 48. Accordingly, only the outer lead ends 34 protrude from the overmold. The assembly of FIG. 6F is substantially the microelectronic-device assembly 60 of FIGS. 3 and 4.

The processes of FIGS. 6A–6F are exemplary and many substantially equivalent variations can be envisioned. For example, the plastic ring 68 can be applied to the front circuit face 36 prior to placing the microelectronic device on the paddle 66. The ring 68 is preferably continuous but can form any shape (a circular shape or that shown in FIG. 3 being two exemplary shapes) that surrounds the sensitive area. In addition, an electrically-conductive filler (e.g., silver flakes) can be added to the material of the ring 68 so that it forms, with the paddle 66, an electrical and magnetic shield over the front circuit face 36.

The lead frame 64 can be formed to position the levels of the paddle 66 and the outer lead ends 34 in various spatial relationships. In FIGS. 3 and 4, they are arranged in a coplanar relationship and in FIGS. 6A–6F they are arranged with the outer lead ends depressed from the level of the paddle (in this latter relationship, each end of the bonding wires is on a common level).

Process steps that exclude extraneous elements from sensitive areas are illustrated in the flow chart 80 of FIG. 7. In a first process step 82, a lead frame is provided that has a tie bar, a paddle and a plurality of elongate leads wherein the paddle is connected to the tie bar and the leads have outer ends connected to the tie bar and inner ends directed toward the die;

In process step 84, the paddle it is spaced from the face, covers the sensitive area and exposes the pads. The sensitive area is surrounded in process step 86 with a plastic ring that abuts the face and the paddle. Each of a plurality of bonding wires is bonded in step 88 between a respective one of the bonding pads and a respective one of the inner ends.

The microelectronic device, the paddle, the ring, the bonding wires and the inner lead ends are encapsulated with an overmold in process step 90. In process step 92, the tie bar (including its tie bar supports) is removed from the paddle and the outer lead ends. Prior to this removal, the leads are preferably solder plated and formed to a selected shape.

In FIGS. 3–6, the shape and/or arrangement of the microelectronic device 22, bonding wires 24, bonding pads 38, the lead frame 64 and its paddle 66 are exemplary as is also the lateral relationship between the microelectronic device and the paddle. FIGS. 3 and 4 show an exemplary relationship in which the paddle 66 is laterally centered over the front circuit face 36.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of encapsulating a microelectronic device which has a circuit face and bonding pads on said circuit face wherein said circuit face has a circuit-face area that includes an area of said bonding pads and a sensitive area, the method comprising the steps of:

providing a conductive-metal lead frame that includes a tie bar, a paddle that has a paddle area which is less than said circuit-face area and which is at least equal to said sensitive area, a plurality of elongate leads which have outer ends coupled to said tie bar and inner ends directed towards said paddle, and at least one tie bar support that couples said tie bar to said paddle;

positioning said paddle so that it is spaced from said circuit face, covers said sensitive area and exposes said bonding pads;

surrounding said sensitive area with a plastic ring that abuts said circuit face and said paddle;

applying at least one of pressure and heat to said plastic ring to enhance its adhesion to said paddle and said circuit face;

bonding each of a plurality of bonding wires between a respective one of said bonding pads and a respective one of said inner ends; and encapsulating said microelectronic device, said paddle, said ring, said bonding wires and said inner ends with an overmold;

a void thereby defined between said circuit face, said paddle and said ring to protect said sensitive area from extraneous elements.

2. The method of claim 1, further including the step of solder plating said outer ends.

3. The method of claim 1, further including the step of selecting the material of said ring to be a thermoplastic material.

4. The method of claim 1, further including the step of selecting the material of said ring to be a thermosetting material.

5. The method of claim 1, further including the step of forming said overmold from a thermosetting material.

6. The method of claim 1, further including the step of including an electrically-conductive filler in said ring.

7. A method of excluding extraneous elements from a sensitive area of a circuit face of a microelectronic device which has bonding pads on said circuit face and wherein said circuit face has a circuit-face area that includes an area of said bonding pads and said sensitive area, the method comprising the steps of:

providing a conductive-metal lead frame which includes a paddle that has a paddle area which is less than said circuit-face area and which is at least equal to said sensitive area, a tie bar, at least one tie bar support that couples said tie bar to said paddle, and elongate leads which have outer ends coupled to said tie bar and inner ends directed towards said paddle;

spacing said paddle from said face so that it covers said sensitive area and exposes said bonding pads;

surrounding said sensitive area with a ring that abuts said face and said paddle;

bonding each of a plurality of bonding wires between a respective one of said bonding pads and a respective one of said inner lead ends; and encapsulating said microelectronic device, said paddle, said ring, said bonding wires and said inner lea d ends with an overmold;

said sensitive area thereby protected from extraneous elements which are excluded from a void defined between said circuit face, said paddle and said ring.

8. The method of claim 7, wherein said ring is a plastic ring and further including the step of applying at least one of pressure and heat to said plastic ring to enhance its adhesion to said paddle and said face.

9. The method of claim 7, further including the steps of removing said tie bar from said outer ends and removing the portion of said tie bar support that extends from said overmold.

10. The method of claim 7, further including the step of the step selecting the material of said overmold to be a thermosetting material.

11. The method of claim 7, further including the step of selecting the material of said ring to be a thermoplastic material.

12. The method of claim 7, further including the step of selecting the material of said ring to be a thermosetting material.

13. A method of encapsulating a microelectronic device which has a circuit face that includes bonding pads and a sensitive area wherein said circuit face has a circuit-face area that includes an area of said bonding pads and said sensitive area, the method comprising the steps of:

providing a conductive-metal lead frame that includes a tie bar, a paddle that has a paddle area which is extended sufficiently to cover said sensitive area and which is limited sufficiently to expose said bonding pads and thereby be less than said circuit-face area, a plurality of elongate leads which have outer ends coupled to said tie bar and inner ends directed away from said tie bar, and at least one tie bar support that couples said tie bar to said paddle;

spacing said paddle from said circuit face so that it covers said sensitive area and exposes said bonding pads;

arranging a plastic preform to surround said sensitive area and abut said circuit face and said paddle;

applying at least one of pressure and heat to said plastic preform to enhance its adhesion to said paddle and said circuit face;

bonding each of a plurality of bonding wires between a respective one of said bonding pads and a respective one of said inner ends; and encapsulating said microelectronic device, said paddle, said preform, said bonding wires and said inner ends with an overmold;

said sensitive area thereby protected from extraneous elements which are excluded from a void defined between said circuit face, said paddle and said ring.

14. The method of claim 13, further including the steps of removing said tie bar from said outer ends and removing the portion of said tie bar support that extends from said overmold.

15. The method of claim 13, further including the step of selecting the material of said preform to be a thermoplastic material.

16. The method of claim 13, further including the step of selecting the material of said preform to be a thermosetting material.

17. The method of claim 13, further including the step of forming said overmold from a thermosetting material.

18. The method of claim 13, further including the step of causing said paddle and said leads to have a coplanar relationship.

19. The method of claim 13, further including the step of including an electrically-conductive filler in said preform.

* * * * *